United States Patent [19]

Shiba

[11] Patent Number: 5,019,922

[45] Date of Patent: May 28, 1991

[54] MULTI-DISK PLAYER WITH AUTOMATIC VOLUME CONTROL

[75] Inventor: Takahumi Shiba, Saitama, Japan

[73] Assignee: Pioneer Electronic Corporation, Tokyo, Japan

[21] Appl. No.: 645,312

[22] Filed: Jan. 24, 1991

Related U.S. Application Data

[63] Continuation of Ser. No. 285,266, Dec. 16, 1988, abandoned.

[30] Foreign Application Priority Data

Dec. 19, 1987 [JP] Japan .................. 62-322504

[51] Int. Cl.⁵ ............................................. G11B 5/027
[52] U.S. Cl. .................................................... 360/69
[58] Field of Search ........................... 360/69; 369/32

[56] References Cited

U.S. PATENT DOCUMENTS

| | | | |
|---|---|---|---|
| 2,149,727 | 3/1939 | Conklin | 178/44 |
| 4,112,384 | 9/1978 | Buchberger | 330/141 |
| 4,256,389 | 3/1981 | Engebretson | 352/11 |
| 4,695,903 | 9/1987 | Serap et al. | 358/335 |
| 4,787,073 | 11/1988 | Masaki | 360/69 |
| 4,792,869 | 12/1988 | Fujita | 360/69 |
| 4,811,122 | 3/1989 | Kido et al. | 360/69 |
| 4,841,386 | 6/1989 | Schiering | 360/69 |
| 4,841,506 | 6/1989 | Kiyoura et al. | 369/32 |

FOREIGN PATENT DOCUMENTS

| | | |
|---|---|---|
| 3733251 | 5/1988 | Fed. Rep. of Germany . |
| 2040100 | 8/1980 | United Kingdom . |
| 164253 | 12/1985 | United Kingdom . |

OTHER PUBLICATIONS

Japanese Abstract, vol. 6, No. 166, p. 138, Aug. 31, 1982.

Primary Examiner—Robert S. Tupper
Attorney, Agent, or Firm—Sughrue, Mion, Zinn, Macpeak & Seas

[57] ABSTRACT

A recording medium reproduction device with automatic volume control which retrieves the current reproducing level in response to a reproducing level memory command and is maintained in memory in a location corresponding to discriminating information for a recording medium is provided. During reproduction, the stored reproduction level corresponding to a recording medium to be played is read out and set based on the discriminating information.

2 Claims, 3 Drawing Sheets

MULTI-DISK PLAYER WITH AUTOMATIC VOLUME CONTROL

This is a continuation of application Ser. No. 07/285,266 filed Dec. 16, 1988, now abandoned.

BACKGROUND OF THE INVENTION

1. Field of the Invention

The present invention relates to a recording medium reproduction device with automatic volume control, and more particularly, to a disk recording medium reproduction device with automatic volume control.

2. Description of the Prior Art

A multi-disk player, for example, which is capable of executing continuous reproduction of music from a plurality of disks, is known, wherein the reproduction of music is programmed in an order selected and specified in advance, or is executed in a random fashion so that music is played by making musical selections in accordance with random numbers or the like, by previously setting the volume for a plurality disks housed in a magazine.

The recording level of disks may not be the same so that when the reproduction level is kept fixed, it results in a variation of the volume in response to the recording level of each disk. Heretofore, in the multi-disk player the reproduction level is kept mixed unless the user adjusts it so that the reproduction level remains the same even when the disk is changed. Therefore, when the recording level is different for each disk housed in the magazine, the sound volume changes every time the disk is changed which is uncomfortable for the listener. Furthermore, in order to avoid such discomfort the user had to manually adjust the sound volume for each disk change.

SUMMARY OF THE INVENTION

In view of the foregoing, it is the object of the present invention to provide a recording medium reproduction device with automatic volume control which is capable of automatically setting the volume for each recording medium during reproduction.

A recording medium reproduction device with automatic volume control according to the present invention retrieves the current reproduction level in response to a reproduction level memory command and maintains that level in memory in a location corresponding to discriminating information for a recording medium, and during reproduction, the stored reproduction level corresponding to a recording medium to be played is read out and set based on the discriminating information.

DETAILED DESCRIPTION OF THE PREFERRED EMBODIMENT

The preferred embodiment of the present invention will be described in detail as follow, with reference to the drawings.

Figure 1:
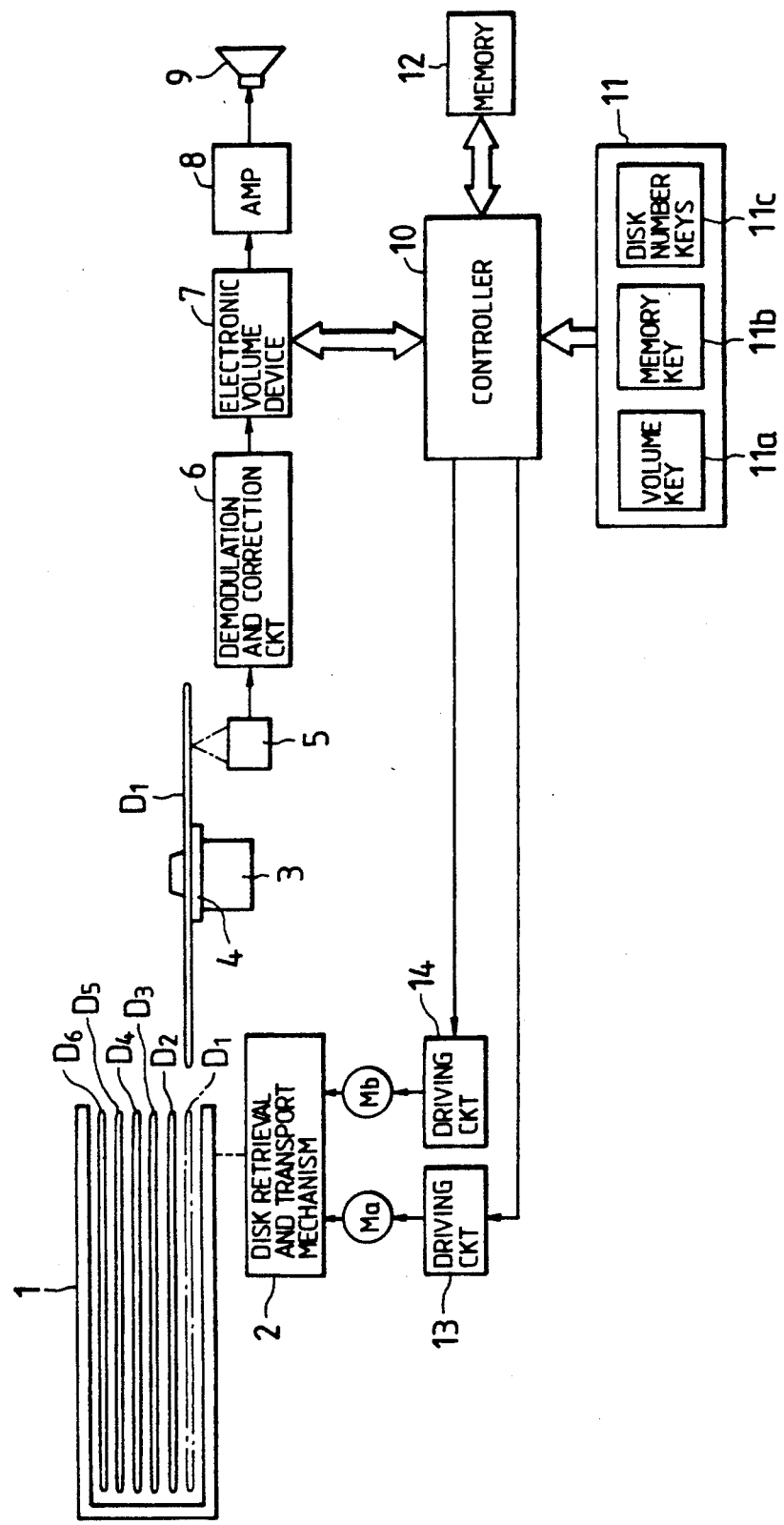
FIG. 1 is a schematic block diagram showing a multi-disk player with automatic volume control in accordance with the present invention.

FIG. 1 is a schematic block diagram showing a multi-disk player with automatic volume control as an example of the recording medium reproduction device with automatic volume control of the present invention. In the figure, a magazine 1 arranges and houses six disks D1-D6, for example, one after another with a predetermined pitch. Six trays (not shown) which carry disks are provided in a manner so that they are freely projectable and retractable with respect to the main body of the magazine. The magazine 1 is freely attachable and detachable on a predetermined mounting part of the player main body. One of the six disks $D_1$ to $D_6$ placed on the six respective trays provided in the magazine 1 is retrieved by a disk retrieval and transport mechanism 2, and then carried onto a turntable 4 fixed to the rotary shaft of a spindle motor 3 where it is clamped.

The disk retrieval and transport mechanism 2 has a thrusting member which thrusts out a tray in the magazine 1 and moves a disk on the tray to the turntable 4. A clamping mechanism which clamps the disk when it is moved by the thrusting mechanism onto the turntable 4, and a moving plate which changes the relative position in the arranging direction of the housed disks of the thrusting member with respect to the magazine 1 are also provided in the disk retrieval and transport mechanism. In addition, a sensor which detects the position of the moving plate, action of the clamping mechanism and the like is disposed in the disk retrieval and transport mechanism.

In the disk retrieval and transport mechanism 2 the moving plate and the thrusting member are driven by motors Ma and Mb, respectively. Selection of a disk is made possible by changing the position of the thrusting member through shifting of the moving plate. The specific structures of the magazine 1 and the disk retrieval and transport mechanism 2 are disclosed in detail in Japanese Patent Laid Open, Gazette No. 62-14369.

Recorded information in a disk rotated by the spindle motor 3 is read by a pickup 5, and after the RF signal which is read therefrom is demodulated in a demodulation and correction circuit 6 and subjected to processing such as error correction, it is supplied to an electronic volume control device 7 which is a level adjusting means. An audio signal whose reproduction level is set in the electronic volume control device 7 is reproduced by a speaker 9 through an amplifier 8. The volume of a reproduced signal issued from the speaker 9 is determined by the reproduction level set in the electronic volume device 7. Setting of the reproduction level is carried out in a controller 10.

The controller 10 consists of a microcomputer which controls the electronic volume device 7 in order to adjust the reproduction level in response to activation of a volume up/down key 11a in a control unit 11. In addition, when a reproduction level memory command is issued as a result of activation of a memory key 11b, the reproduction level at that time is retrieved from the electronic volume device 7, and stored in a memory such as a RAM, which corresponds to discriminating information of a disk such as disk number (which is input through a disk number key 11c) which shows the order in which the disks are housed in the magazine 1.

During reproduction the controller 10 reads the reproduction level corresponding to the disk to be played from the memory 12 based on the disk number, and controls the electronic volume device 7 so that the signal which is output coincides with the reproduction level which was read out. Furthermore, the controller 10 executes various controls required for continuous playing, programmed playing or random playing, and also controls the motors Ma and Mb discussed previously via driving circuits 13 and 14.

Figure 2:
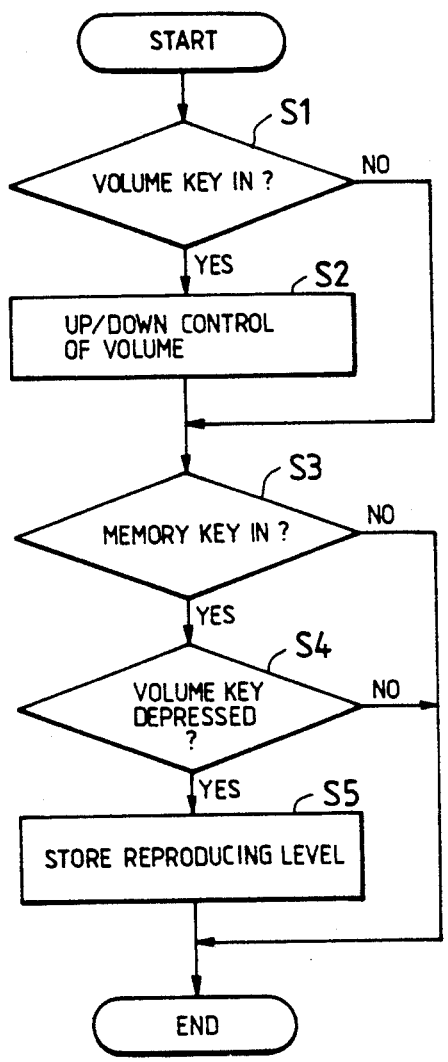
FIGS. 2 and 3 are flow charts showing the procedure for setting the volume in the multi-disk player of FIG. 1

Next, the procedure performed by the processor of the controller 10 for storing the reproduction level will be described with reference to the flow chart in FIG. 2.

When the processor detects activation of the volume up/down key 11a of the control part 11 (step S1), it controls the electronic volume device 7 in order to raise or lower the reproduction level (step S2). Next, when activation of the memory key 11b to issue a reproduction level memory command is detected (step S3), confirmation that there was an input through the volume up/down key 11a is performed (step S4). If confirmed, then the reproduction level at that time is stored in the memory 12 at a location corresponding to the disk number (step S5). Here, it is assumed that the disk numbers have been specified beforehand by the disk number keys 11c "1" to "6" prior to the setting of the reproduction level.

Figure 3:
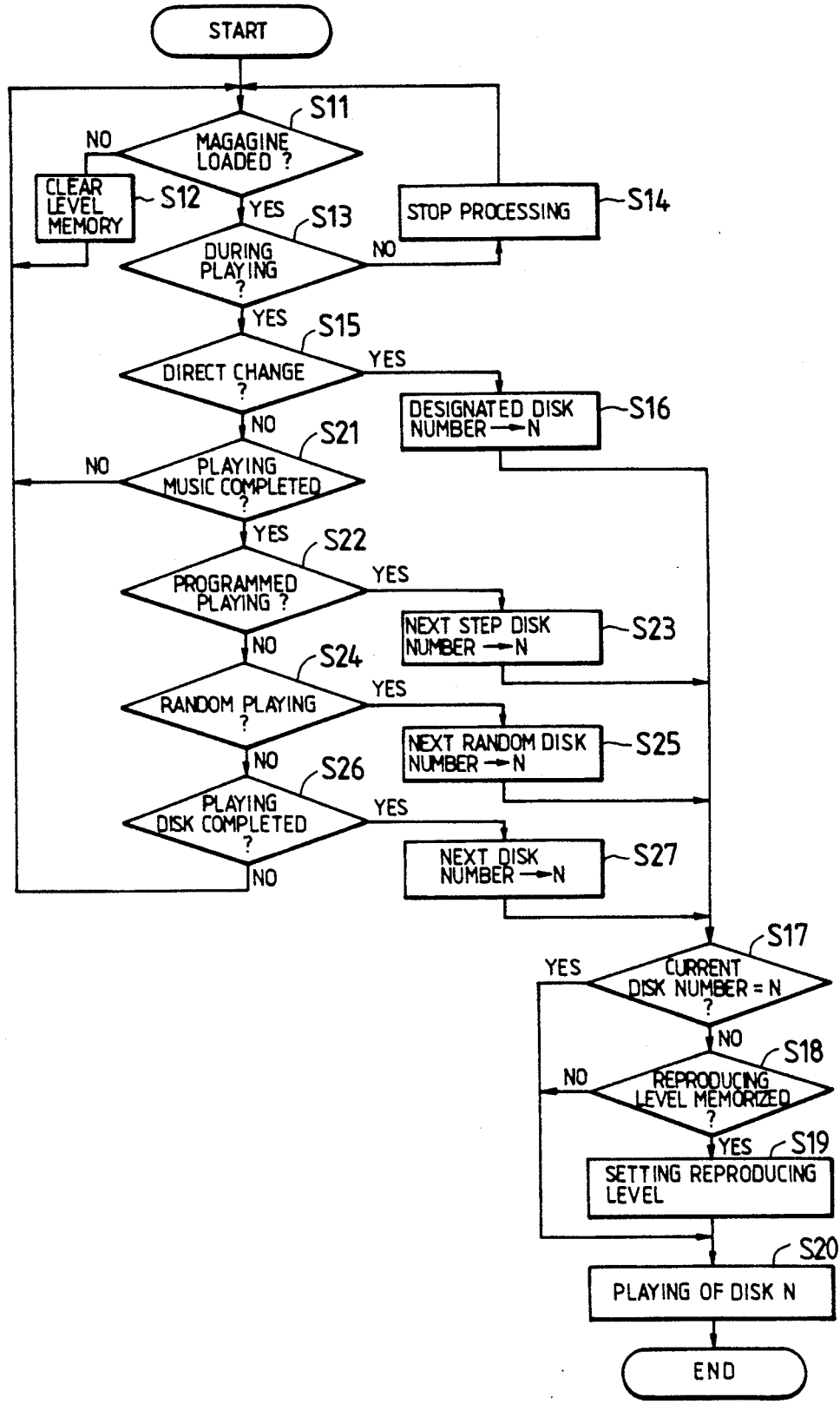

Next, referring to the flow chart in FIG. 3, the procedure for automatically setting the volume based on the reproduction level, which has been stored for each disk according to the procedure set forth above, will be described.

The processor first determines whether or not the magazine 1 is loaded (step S11), and if it is found that it is not loaded, clears the memory in which the reproduction level is to be stored (step S12), and returns to step S11. If, on the other hand, the magazine 1 is loaded, a determination is made whether or not the device is playing (step S13), and if it is found that the device is not playing, processing is performed to stop processing (step S14), and then returns to step S11. If it is found to be playing, a determination is made whether or not a change of a disk was specified by the indication of a disk number "1" to "6" by means of the disk number keys 11c (step S15), and retrieves the specified disk number in the case of a direct change (step S16).

Subsequently, it is determined whether or not the specified disk number coincides with the current disk number, namely, whether or not the specified disk is the same one which is currently being played (step S17). When the specified disk differs from the disk currently being played, it is determined whether or not the reproduction level of the specified disk is stored in the memory 12 (step S18). If it is found that it was already stored, the reproduction level of the disk is read out of the memory 12 and set, based on the specified disk number (step S19), and the device proceeds to play that disk (step S20). When it is determined in step S17 that the specified disk is the same as that which is currently being played, or when it is determined in step S18 that the reproduction level of the specified disk is not stored in the memory 12, the device proceeds as is to step S20, and starts playing with the current reproduction level maintained as it is.

In step S15 when it is determined that there is no disk change specification, a determination is made whether or not the music being reproduced is completed (step S21). If the music being reproduced has not yet completed, it returns to step S11. When it is found that the music being reproduced has ended, a determination is made whether or not it is programmed playing (step S22), and if it is determined to be programmed playing, the disk number for the next step is called up (step S23), and then proceeds to step S17 to determine whether or not the disk to be played next is the same as that currently being played. Following this, steps S18 to S20 described above will be executed.

In step S22, when it is determined that it is not programmed playing, a determination is made whether or not it is random playing (step S24), and if it is determined to be random playing, the disk number to be randomly played next is called up (step S25), and then proceeds to step S17 to determine whether or not the disk to be played next is the same as that currently being played. Following this, actions for steps S18 to S20 described above will be executed.

When a determination is made in step S24 that the device is not in a random play mode, a determination is made whether or not the music of the disk now being played is completed (step S26), and if it is found that it is not completed yet, the device returns to step S11. When music of the disk currently being played ends, the number of next disk to be played is retrieved (step S27), then the device proceeds to step S17 to determine whether or not the disk to be played next is the same as that currently being played. After these steps, steps S18 to S20 described above will be executed.

In this manner, the present invention eliminates the nuisance for the user in adjusting the volume every time he changes a disk, by setting reproduction level for each disk and storing it in advance in a location in memory corresponding to the disk number, and during reproduction selecting the stored reproduction level based on the disk number thereby automatically setting the volume for each disk. Accordingly, when the recording level is different for each disk housed in the magazine 1, for example, reproduction can be executed with constant volume without the need to adjust the volume at every disk change, by setting and storing the reproduction level of each disk in advance. Therefore, any discomfort the listener might experience due to volume change at each disk change can be eliminated. In addition, in dubbing a disk, there is no need to fine-tune the recording level at every disk change. On the contrary, effective reproduction of music can be enjoyed because a volume suitable to the program contents can be set automatically by arbitrarily varying the reproduction levels in response to the program contents of the disks.

Figure 4:
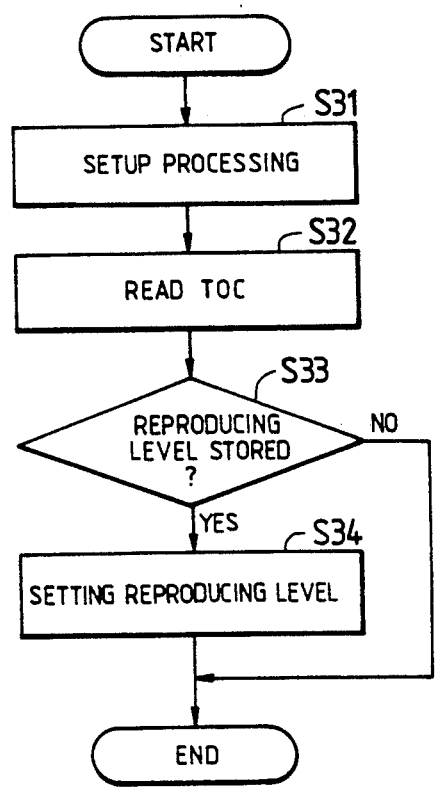
FIG. 4 is a flow chart showing the procedure for volume setting for the single-disk player.

It should be noted that although the present invention has been described in conjunction with a multi-disk player, it can be applied also to a single-disk player. In the case of the single-disk player, one needs only to use TOC (Table of Contents) information read from each disk as discriminating information, and store the reproduction level and TOC information as a pair for each disk. During reproduction, the device proceeds as shown in FIG. 4. Namely, after executing setup processing for the loaded disks (step S31), reading the TOC information of the disks (step S32), it determines whether or not the reproduction level of the disk discriminated by the TOC information read out, is stored (step S33). When it is stored, the stored reproduction level is read out and set based on the TOC information (step S34), and then the device proceeds to subsequent search and play operations. When the reproduction level for a disk to be played is not stored, it proceeds to search and play operations with the reproduction level that is set in the electronic volume device 7 at that time.

Moreover, the recording medium reproduction device with automatic volume control is not limited to disk players, and may be applied to tape decks. In the case of a tape deck, a bar code, for example, may be disposed on each side of the cassette for use as discriminating information for the cassette tape.

Furthermore, in each of the embodiments in the foregoing, it is assumed that the reproduction level is stored corresponding to the discriminating information of each recording medium. However, it is also possible to store the recording level along with the program for each playing program.

As described in the foregoing, according to the recording medium reproduction device with automatic volume control of the present invention, it is possible to set the volume automatically for each recording medium, by retrieving the current reproduction level in response to a reproduction level memory command, and maintaining it stored in a location corresponding to discriminating information for recording medium, and during reproduction reading and setting the stored reproduction level corresponding to the recording medium to be played based on the discriminating information. Therefore, the nuisance to the user of having to adjust the volume every time the recording medium is changed, can be eliminated, and the device becomes very convenient to use.

In particular, in a recording medium reproduction device with automatic volume control for playing music by automatically changing the recording medium, when the recording level is different from one recording medium to another, discomfort during listening due to a change in the volume which occurs at every change of the recording medium can be eliminated, by setting the reproduction level for each recording medium in advance.

What is claimed is:

1. A multi-disk player with automatic volume control provided with a magazine including a magazine case and a plurality of trays for carrying disks, said trays being arranged in order so as to be capable of freely projecting and retracting with respect to the magazine case, wherein a tray corresponding to a disk designating number is projected and a disk placed in said magazine is transported to a playing position so as to be played, said multi-disk player comprising:

designating means for designating a disk number;

level adjusting means for adjusting the reproduction level of a signal read from a disk being played;

memory control means, including memory means, for retrieving a current reproduction level of said level adjusting means in response to a reproduction level memory command, and storing said current reproduction level in said memory means with respect to said disk number; and level setting means for reading said stored reproduction level corresponding to a disk to be played from said memory means in response to said disk number and setting the reproduction level of said level adjusting means to said read reproduction level for playing the disk.

2. The multi-disk player as recited in claim 1, wherein said level setting means seta said reproduction level of said level adjusting means to a previously set reproduction level when the reproduction level for a disk to be played has not been stored in said memory.

* * * * *